(12) United States Patent
Nakagawasai et al.

(10) Patent No.: US 12,211,706 B2
(45) Date of Patent: Jan. 28, 2025

(54) SUBSTRATE PROCESSING DEVICE AND METHOD OF MANUFACTURING SUBSTRATE PROCESSING DEVICE

(71) Applicant: TOKYO ELECTRON LIMITED, Tokyo (JP)

(72) Inventors: Manabu Nakagawasai, Tokyo (JP); Satoshi Takeda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 995 days.

(21) Appl. No.: 17/198,005

(22) Filed: Mar. 10, 2021

(65) Prior Publication Data

US 2021/0287916 A1 Sep. 16, 2021

(30) Foreign Application Priority Data

Mar. 11, 2020 (JP) ................. 2020-042207

(51) Int. Cl.
| | |
|---|---|
| *H01L 21/48* | (2006.01) |
| *C23C 14/50* | (2006.01) |
| *C23C 14/54* | (2006.01) |
| *H01J 37/34* | (2006.01) |
| *H01L 21/228* | (2006.01) |

(Continued)

(52) U.S. Cl.
CPC .......... *H01L 21/4871* (2013.01); *C23C 14/50* (2013.01); *C23C 14/541* (2013.01); *H01J 37/3488* (2013.01); *H01L 21/228* (2013.01); *H01L 21/52* (2013.01); *H01L 21/67109* (2013.01); *H01L 21/6831* (2013.01)

(58) Field of Classification Search
CPC ... H01L 21/4871; H01L 21/228; H01L 21/52; H01L 21/67019; H01L 21/6831; H01L 21/67017; H01L 21/68742; H01L 21/68792; H01L 21/67011; H01L 21/0201; H01L 21/67207; C23C 14/34; C23C 14/50; C23C 14/541; H01J 37/3488; H01J 2237/002
USPC .................................................. 204/298.15
See application file for complete search history.

(56) References Cited

U.S. PATENT DOCUMENTS

| | | | |
|---|---|---|---|
| 10,763,153 B2 | 9/2020 | Tashiro et al. | |
| 2019/0103301 A1 | 4/2019 | Tashiro et al. | |

FOREIGN PATENT DOCUMENTS

| | | | |
|---|---|---|---|
| JP | 2011-127136 A | 6/2011 | |
| JP | 5815743 B | 11/2015 | |

(Continued)

*Primary Examiner* — Rodney G McDonald
(74) *Attorney, Agent, or Firm* — Fenwick & West LLP

(57) ABSTRACT

A substrate processing device is provided. The substrate processing device includes a processing container including a mounting table, a refrigeration device disposed to have a gap between the mounting table and the refrigeration device, a first elevating device configured to raise or lower the refrigeration device, a refrigerant flow path to supply a refrigerant to the gap, a compression device configured to compress the refrigerant supplied to the refrigerant flow path, and refrigerant transfer pipes connected to both a first connection-fixing unit which is a flow path port of the refrigerant flow path and a second connection-fixing unit fluid-communicating with the compression device. Further, each of the refrigeration transfer pipes extends such that at least a portion of the refrigerant transfer pipe is curved between the first and second connection-fixing units, and each of the refrigerant transfer pipes is placed on a support member at the second connection-fixing unit.

18 Claims, 2 Drawing Sheets

(51) Int. Cl.
*H01L 21/52* (2006.01)
*H01L 21/67* (2006.01)
*H01L 21/683* (2006.01)

(56) References Cited

FOREIGN PATENT DOCUMENTS

| | | |
|---|---|---|
| JP | 2018-188799 A | 11/2018 |
| WO | WO 2017/221631 A1 | 12/2017 |

SUBSTRATE PROCESSING DEVICE AND METHOD OF MANUFACTURING SUBSTRATE PROCESSING DEVICE

CROSS-REFERENCE TO RELATED APPLICATION

This application claims priority to Japanese Patent Application No. 2020-042207, filed on Mar. 11, 2020, the entire contents of which are incorporated herein by reference.

TECHNICAL FIELD

Exemplary embodiments of the present disclosure relate to a substrate processing device and a method of manufacturing the substrate processing device.

BACKGROUND

Japanese Patent No. 5815743 discloses a vacuum processing device including a vacuum vessel, a target holder, a substrate holder, a tilting unit which rotates the substrate holder around a rotation axis to tilt a substrate with respect to a target, a compression device disposed outside the vacuum vessel, and a cooling device for cooling the substrate. The vacuum processing device further includes a transfer unit through which a refrigerant is transferred between the compression device and the cooling device, and an accommodating unit in which the transfer unit is accommodated outside the vacuum vessel without exceeding a predetermined curvature radius. The accommodating unit includes a connector which has one end connected to the cooling device and the other end connected to the transfer unit and is rotated according to a rotation operation of the substrate holder, and a first guide which guides the transfer unit while bending the transfer unit within a range not exceeding a predetermined curvature radius according to a rotation operation of the connector.

SUMMARY

The present disclosure relates to a substrate processing device in which a refrigerant transfer pipe connects a compression device and a refrigeration device raised or lowered relative to the compression device, and provides a substrate processing device and a method of manufacturing the substrate processing device capable of suppressing damages of the refrigerant transfer pipe connected and fixed to a connection-fixing unit connected to the compression device when the refrigeration device is raised or lowered.

In accordance with an aspect of the present disclosure, there is provided a substrate processing device. The substrate processing device includes a processing container including a mounting table on which a substrate is mounted and a target holder configured to hold a target, in the processing container; a refrigeration device disposed to have a gap between a lower surface of the mounting table and the refrigeration device, the refrigeration device having a refrigerator and a refrigerating heat medium stacked on the refrigerator; a first elevating device configured to raise or lower the refrigeration device; a refrigerant flow path provided inside the refrigeration device to supply a refrigerant to the gap; a compression device configured to compress the refrigerant supplied to the refrigerant flow path; and refrigerant transfer pipes connected and fixed to both a first connection-fixing unit which is a flow path port of the refrigerant flow path in the refrigeration device and a second connection-fixing unit which fluid-communicates with the compression device. Further, each of the refrigeration transfer pipes extends in a state in which at least a portion of the refrigerant transfer pipe is curved between the first connection-fixing unit and the second connection-fixing unit, and each of the refrigerant transfer pipes is placed on a support member at the second connection-fixing unit.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
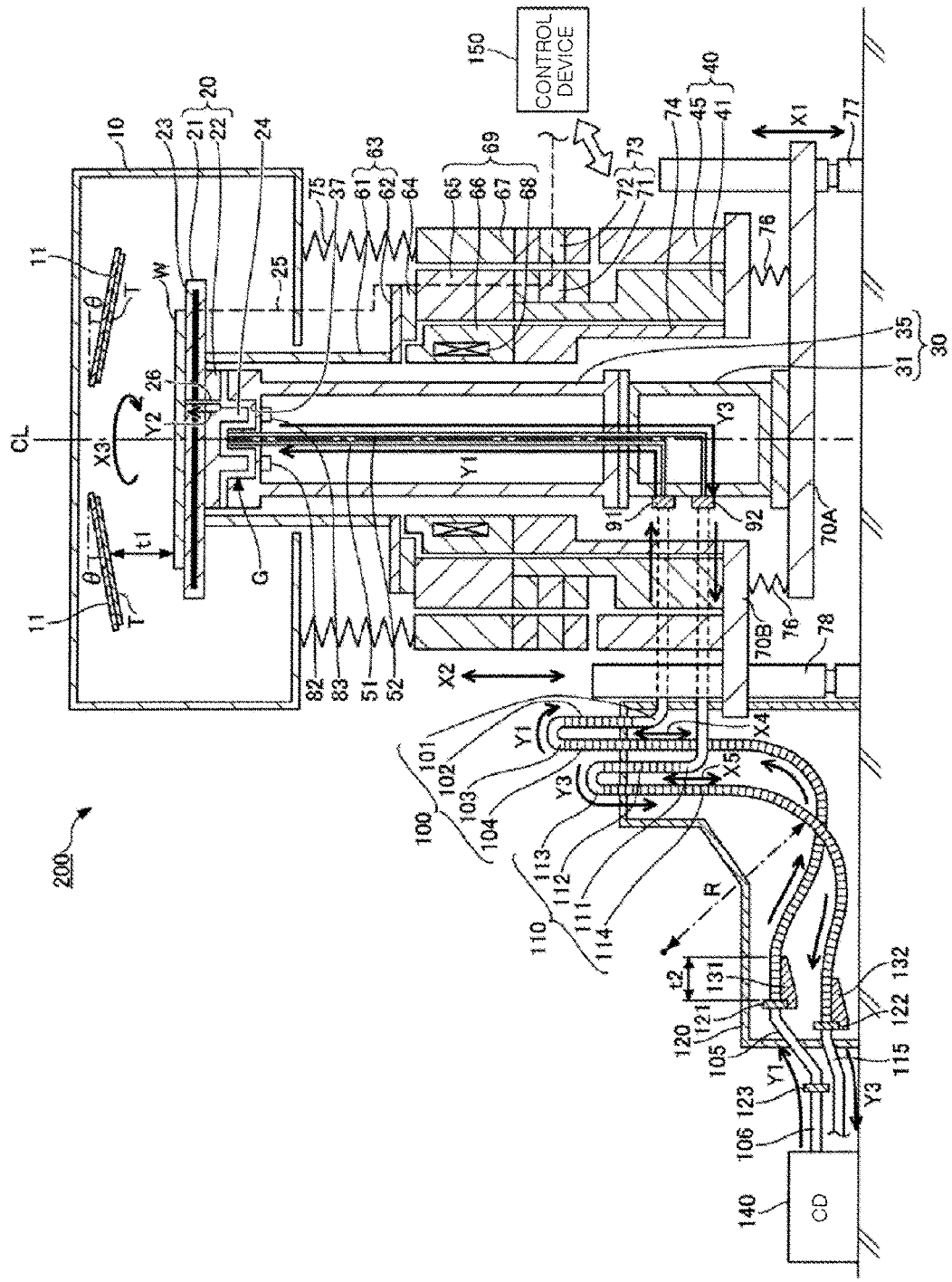
FIG. 1 is a vertical cross-sectional view illustrating an example of a substrate processing device according to an embodiment.

Hereinafter, a substrate processing device and a method of manufacturing the substrate processing device according to an embodiment of the present disclosure will be described with reference to the accompanying drawings. Moreover, in the present specification and the drawings, substantially the same components may be designated by the same reference numerals, and overlapping descriptions thereof may be omitted.

(Substrate Processing Device and Method of Manufacturing Substrate Processing Device According to Embodiment)

Examples of a substrate processing device and a method of manufacturing the substrate processing device according to an embodiment of the present disclosure will be described with reference to FIGS. 1 and 2. Here, FIG. 1 is a vertical cross-sectional view illustrating an example of the substrate processing device according to the embodiment, and FIG. 2 is a diagram illustrating an example of a hardware configuration of a control device constituting the substrate processing device, together with a peripheral device.

Figure 2:
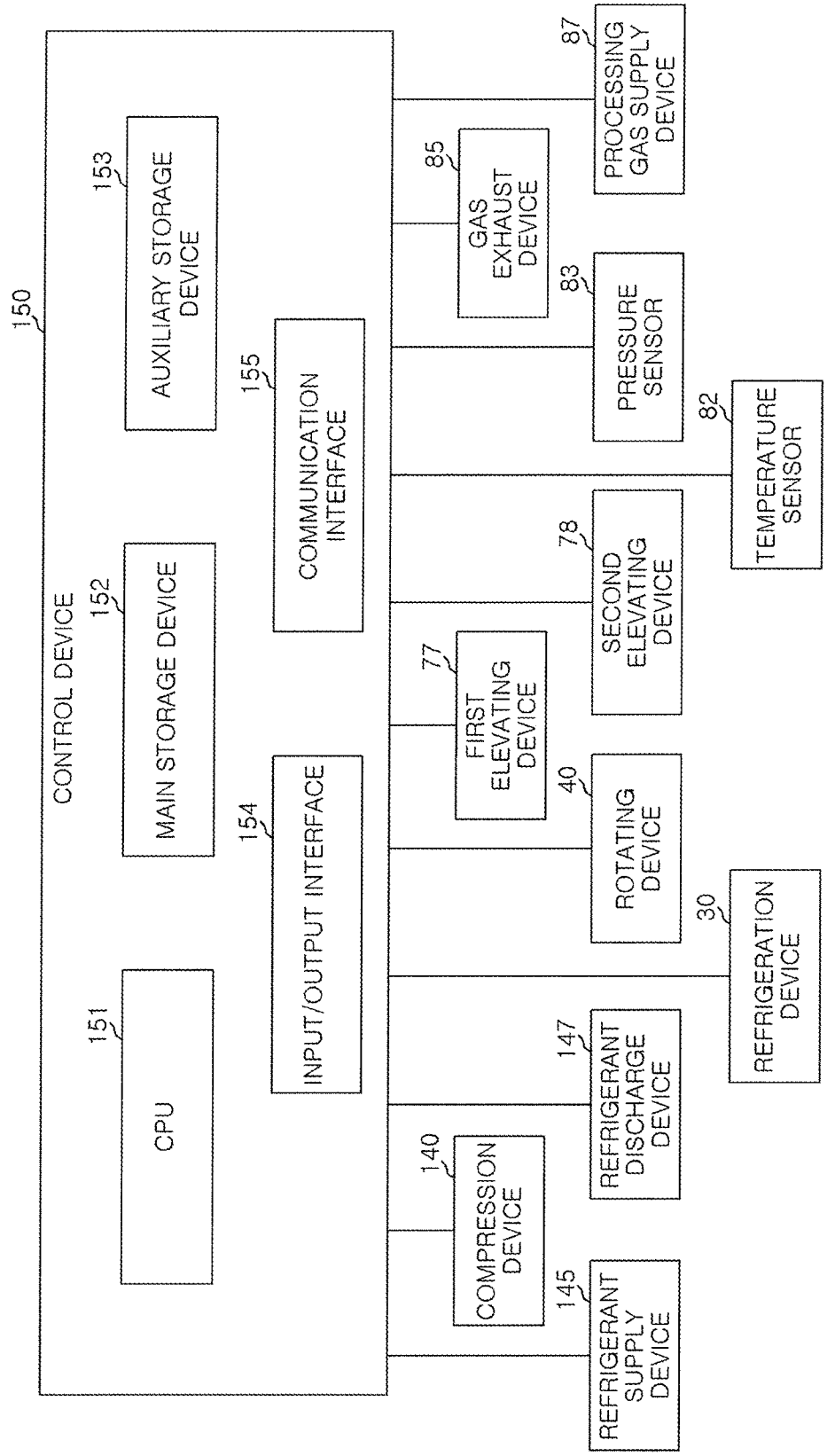
FIG. 2 is a diagram illustrating an example of a hardware configuration of a control device constituting a substrate processing device, together with a peripheral device.

For example, a substrate processing device 200 illustrated in FIG. 1 is a Physical Vapor Deposition (PVD) device which forms a magnetic film or the like with respect to a substrate W such as a semiconductor wafer or the like which is a workpiece inside a processing container 10 which forms an ultra-high vacuum and an ultra-low temperature atmosphere and executes substrate processing with a processing gas. Here, for example, the ultra-high vacuum means a pressure atmosphere of $10^{-5}$ Pa or less, and the ultra-low temperature means a temperature atmosphere of −30° C. or lower, for example, about −200° C. For example, the magnetic film formed on the substrate W is used in a Tunneling Magneto Resistive (TMR) element.

The substrate processing device 200 includes the processing container 10, a mounting table 20 on which the substrate W is placed inside the processing container 10, a refrigeration device 30, a rotating device 40 for rotating the mounting table 20, a second elevating device 78 for raising or lowering the mounting table 20, and a first elevating device 77 for raising or lowering the refrigeration device 30. The substrate processing device 200 further includes a compression device (CD) 140 which compresses a refrigerant, and a control device 150 which controls various devices such as the refrigeration device 30, the compression device 140, and the first elevating device 77. In addition, the substrate processing device 200 of the illustrated example includes two elevating devices such as the second elevating device 78 for raising or lowering the mounting table 20 and the first elevating device 77 for raising or lowering the refrigeration device 30, but the mounting table 20 and the refrigeration device 30 may be raised or lowered by a common elevating device.

Inside the processing container 10, there is the mounting table 20 below, and a plurality of target holders 11 are fixed above the mounting table 20 with a predetermined inclination angle θ with respect to a horizontal plane. Then, a different type of target T is attached to a lower surface of each target holder 11.

Further, the processing container 10 is configured so that an inside thereof is depressurized to an ultra-high vacuum by operating a gas exhaust device (not illustrated) such as a vacuum pump. Further, a processing gas (for example, a rare gas such as argon (Ar), krypton (Kr), or neon, or nitrogen ($N_2$) gas) required for sputter film formation is supplied to the processing container 10 through a gas supply pipe (not illustrated) communicating with a processing gas supply device (not illustrated).

An AC voltage or a DC voltage from a plasma generation power source (not illustrated) is applied to the target holder 11. When an AC voltage is applied to the target holder 11 and the target T from the plasma generation power source, plasma is generated inside the processing container 10, a rare gas or the like inside the processing container 10 is ionized, and the target T is sputtered by ionized rare gas elements. Atoms or molecules of the sputtered target T are deposited on a surface of the substrate W held on the mounting table 20 facing the target T.

Since the target T is inclined with respect to the substrate W, an incident angle at which the particles sputtered from the target T are incident on the substrate W can be adjusted, and thus it is possible to improve in-plane uniformity of a film thickness of the magnetic film or the like formed on the substrate W. Moreover, even when the target holders 11 are installed at the same inclination angle θ inside the processing container 10, the mounting table 20 is raised or lowered to change a distance t1 between the target T and the substrate W, and thus the incident angles of the sputtered particles with respect to the substrate W can be changed. Therefore, the mounting table 20 is controlled to be raised or lowered so that the distance becomes the distance t1 suitable for each target T for each applied target T.

The number of targets T is not particularly limited, but from the viewpoint that different films formed of different materials can be sequentially formed by one substrate processing device 200, a plurality of different targets T may be present inside the processing container 10. For example, when the magnetic film (a film containing a ferromagnetic material such as Ni, Fe, Co) is deposited, CoFe, FeNi, or NiFeCo may be used as a material of the target T. Further, as the material of the target T, a material in which other elements are mixed with these materials may also be used.

The mounting table 20 is disposed above the refrigeration device 30 which is constituted by stacking a refrigerator 31 and a refrigerating heat medium 35. More specifically, the mounting table 20 is disposed with a gap G between the mounting table 20 and an upper surface of the refrigerating heat medium 35. In addition, the refrigerating heat medium 35 may also be referred to as a cold link.

The refrigerator 31 holds the refrigerating heat medium 35 and cools the upper surface of the refrigerating heat medium 35 to an extremely low temperature. From the viewpoint of cooling capacity, the refrigerator 31 may use a Gifford-McMahon (GM) cycle.

The refrigerating heat medium 35 is fixed on the refrigerator 31, and an upper portion of the refrigerating heat medium 35 is accommodated inside the processing container 10. The refrigerating heat medium 35 is made of copper (Cu) or the like having high thermal conductivity, and an outer shape of the refrigerating heat medium 35 is approximately cylindrical. The refrigerating heat medium 35 is disposed so that the center thereof coincides with the central axis CL of the mounting table 20.

A refrigerant supply flow path 51 (an example of a refrigerant flow path) through which the refrigerant (a cooling gas) is supplied to the gap G between the refrigerating heat medium 35 and the mounting table 20 and a refrigerant discharge flow path 52 (an example of the refrigerant flow path), through which the refrigerant of which a temperature has been raised by heat transfer from the mounting table 20 is discharged, are disposed inside the refrigerating heat medium 35 and the refrigerator 31. The refrigerant supply flow path 51 and the refrigerant discharge flow path 52 are fixed to first connection-fixing units (91, 92) provided on a wall surface of the refrigerator 31, respectively. A first refrigerant transfer pipe 100 and a second refrigerant transfer pipe 110 (both are examples of a refrigerant transfer pipe) are connected to the first connection-fixing units 91 and 92, respectively.

The refrigerant supplied from a refrigerant supply device (not illustrated) and compressed by the compressor 140 is pressure-fed through the first refrigerant transfer pipe 100 in a Y1 direction and is supplied to the gap G through the refrigerant supply flow path 51 inside the refrigeration device 30.

Meanwhile, the refrigerant discharged from the gap G flows through the refrigerant discharge flow path 52 in a Y3 direction and is discharged to a refrigerant discharge device (not illustrated) through the second refrigerant transfer pipe 110. Moreover, the refrigerant supply flow path and the refrigerant discharge flow path may be formed by the same flow path. As the refrigerant supplied to the gap G for cooling the mounting table 20, helium (He) gas having high thermal conductivity may preferably be used. By supplying the refrigerant to the gap G through the refrigerant supply flow path 51, the mounting table 20 can be cooled to an extremely low temperature. Moreover, instead of the cooling gas, a heat conductive grease having high heat conductivity may be applied to the refrigerant.

The mounting table 20 has a structure in which an upper first plate 21 on which the substrate W is placed and a lower second plate 22 are stacked, and both plates are made of copper (Cu) having high thermal conductivity. The first plate 21 includes an electrostatic chuck and the electrostatic chuck has a chuck electrode 23 embedded in a dielectric film. A predetermined potential is applied to the chuck electrode 23 via a wire 25. According to this configuration, the substrate W can be hold by the electrostatic chuck and the substrate W can be fixed to the upper surface of the mounting table 20. Moreover, in addition to the stacked body of the first plate 21 and the second plate 22, the mounting table 20 may be formed entirely by one plate or may be integrally molded by sintering or the like.

Further, the mounting table 20 includes a through hole 26 which vertically passes through the first plate 21 and the second plate 22. The through hole 26 communicates with the gap G below the mounting table 20, and the refrigerant supplied to the gap G is supplied between the upper surface of the mounting table 20 (electrostatic chuck) and the lower surface of the substrate W in a Y2 direction through the through hole 26. Accordingly, it is possible to efficiently transfer cold heat of the refrigerant or the refrigerating heat medium 35 to the substrate W. Moreover, in the illustrated example, the refrigerant flowing through the refrigerant supply flow path 51 is supplied to the lower surface of the substrate W through the through hole 26, and the refrigerant discharged through the through hole 26 is discharged through the refrigerant discharge flow path 52. However, other refrigerant supply and discharge forms may be used. For example, the refrigerant supply flow path 51 and the refrigerant discharge flow path 52 may have different independent refrigerant flow paths with respect to the through hole 26, and the refrigerant passing through the through hole 26 may be supplied or discharged through the independent refrigerant flow paths.

A protrusion 24 which protrudes toward the refrigerating heat medium 35 side is formed on the lower surface of the second plate 22 that constitutes the mounting table 20. The protrusion 24 in the illustrated example is an annular protrusion which surrounds the central axis CL of the mounting table 20. For example, a height of the protrusion 24 may be set to 40 mm to 50 mm, and a width of the protrusion 24 may be set to 6 mm to 7 mm. Moreover, a shape of the protrusion 24 is not particularly limited, but the protrusion 24 may have a large surface area from the viewpoint of increasing heat exchange efficiency with the refrigerating heat medium 35. For example, the protrusion 24 may have a wavy outer surface, or an outer surface of the protrusion 24 may be subjected to uneven processing by blasting or the like. In either case, the surface area of the protrusion 24 can increase, and thus the heat exchange efficiency with the refrigerating heat medium 35 can increase.

A recess 37 into which the protrusion 24 is loosely fitted is formed on the upper surface of the refrigerating heat medium 35, that is, on the surface facing the protrusion 24 of the mounting table 20. The recess 37 in the illustrated example has an annular shape surrounding the central axis CL of the mounting table 20. A height of the recess 37 may be the same as the height of the protrusion 24 and may be 40 mm to 50 mm, for example. Further, for example, a width of the recess 37 may be slightly wider than the width of the protrusion 24 and is preferably 7 mm to 9 mm. Moreover, a shape of the recess 37 may be set to correspond to the shape of the protrusion 24. For example, when the outer surface of the protrusion 24 has a wavy shape, an inner surface of the recess 37 may also have a corresponding wavy shape. Further, the inner surface of the recess 37 may also be subjected to uneven processing by blasting or the like, and the uneven processing increases the surface area of the recess 37 and thus can improve the heat exchange efficiency with the mounting table 20.

In a state where the protrusion 24 is loosely fitted into the recess 37, the gap G is formed between the recess 37 and the protrusion 24.

The mounting table 20 is supported by an outer cylinder 63. The outer cylinder 63 is disposed to cover an outer peripheral surface of the upper portion of the refrigerating heat medium 35, and an upper portion of the outer cylinder 63 enters the inside of the processing container 10 and supports the mounting table 20 inside the processing container 10. The outer cylinder 63 has a cylindrical portion 61 having an inner diameter slightly larger than an outer diameter of the refrigerating heat medium 35, and a flange 62 extending in an outer diameter direction on a lower surface of the cylindrical portion 61, and the cylindrical portion 61 directly supports the mounting table 20. For example, the cylindrical portion 61 and the flange 62 are formed of a metal such as stainless steel.

A heat insulating member 64 is connected to the lower surface of the flange 62. The heat insulating member 64 has an approximately cylindrical shape extending coaxially with the flange 62 and is fixed to the lower surface of the flange 62. The heat insulating member 64 is made of ceramics such as alumina. A magnetic fluid seal portion 69 is provided on the lower surface of the heat insulating member 64.

The magnetic fluid seal portion 69 has a rotating portion 65, an inner fixing portion 66, an outer fixing portion 67, and a heating unit 68. The rotating portion 65 has an approximately cylindrical shape extending coaxially with the heat insulating member 64 and is fixed to the lower surface of the heat insulating member 64. In other words, the rotating portion 65 is connected to the outer cylinder 63 via the heat insulating member 64. According to this configuration, the heat transfer of the cold heat of the outer cylinder 63 to the rotating portion 65 is blocked by the heat insulating member 64, and a temperature of a magnetic fluid of the magnetic fluid seal portion 69 decreases, and thus it is possible to suppress a decrease in sealing performance or occurrence of dew condensation.

The inner fixing portion 66 is provided between the refrigerating heat medium 35 and the rotating portion 65 via a magnetic fluid. The inner fixing portion 66 has an approximately cylindrical shape in which an inner diameter thereof is larger than the outer diameter of the refrigerating heat medium 35 and an outer diameter thereof is smaller than an inner diameter of the rotating portion 65. The outer fixing portion 67 is provided outside the rotating portion 65 via a magnetic fluid. The outer fixing portion 67 has an approximately cylindrical shape in which the inner diameter thereof is larger than an outer diameter of the rotating portion 65. The heating unit 68 is embedded inside the inner fixing portion 66 and heats the entire magnetic fluid seal portion 69. According to this configuration, it is possible to prevent the temperature of the magnetic fluid of the magnetic fluid seal portion 69 from decreasing, and thus it is possible to suppress the decrease in the sealing performance and the occurrence of dew condensation. According to this configuration, in the magnetic fluid seal portion 69, the rotating portion 65 is rotatable with respect to the inner fixing portion 66 and the outer fixing portion 67 in an airtight state. That is, the outer cylinder 63 is rotatably supported via the magnetic fluid seal portion 69.

An approximately cylindrical bellows 75 is provided between the upper surface of the outer fixing portion 67 and the lower surface of the processing container 10. The bellows 75 is a metal bellows structure which can be expanded and contracted in a vertical direction. The bellows 75 surrounds the upper portion of the refrigerating heat medium 35, the lower portion of the outer cylinder 63, and the heat insulating member 64 and separates an internal space of the processing container 10, of which a pressure can be reduced, and an external space of the processing container 10.

A slip ring 73 is provided below the magnetic fluid seal portion 69. The slip ring 73 has a rotating body 71 including a metal ring and a fixed body 72 including a brush. The rotating body 71 has an approximately cylindrical shape extending coaxially with the rotating portion 65 of the magnetic fluid seal portion 69 and is fixed to the lower surface of the rotating portion 65. The fixed body 72 has an approximately cylindrical shape in which an inner diameter thereof is slightly larger than an outer diameter of the rotating body 71. The slip ring 73 is electrically connected to a DC power supply (not illustrated) and supplies power supplied from the DC power supply to the wire 25 via the brush of the fixed body 72 and the metal ring of the rotating body 71. According to this configuration, it is possible to apply an electric potential to the chuck electrode from the DC power supply without twisting the wire 25. The rotating body 71 constituting the slip ring 73 is attached to the rotating device 40. Moreover, the slip ring may have a structure other than the brush structure, for example, a non-contact power feeding structure, a structure having a mercury-free or conductive liquid, or the like.

The rotating device 40 is a direct drive motor having a rotor 41 and a stator 45. The rotor 41 has an approximately cylindrical shape extending coaxially with the rotating body 71 of the slip ring 73 and is fixed to the rotating body 71. The stator 45 has an approximately cylindrical shape in which an inner diameter thereof is larger than an outer diameter of the rotor 41. According to this configuration, when the rotor 41 rotates, the rotating body 71, the rotating portion 65, the outer cylinder 63, and the mounting table 20 rotate in an X3 direction relative to the refrigerating heat medium 35. Moreover, the rotating device may have a form other than the direct drive motor or may have a form including a servo-motor and a transmission belt.

Further, a heat insulating body 74 having a vacuum heat insulating double structure is provided around the refrigerator 31 and the refrigerating heat medium 35. In the illustrated example, the heat insulating body 74 is provided between the refrigerator 31 and the rotor 41, and between the lower portion of the refrigerating heat medium 35 and the rotor 41. According to this configuration, it is possible to prevent the cold heat of the refrigerator 31 and the refrigerating heat medium 35 from being transferred to the rotor 41.

Further, the refrigerator 31 is fixed to an upper surface of a first support base 70A which is attached to the first elevating device 77 in a vertically movable manner. Meanwhile, the rotating device 40 or the heat insulating body 74 is fixed to an upper surface of a second support base 70B which is attached to the second elevating device 78 in a vertically movable manner. An approximately cylindrical bellows 76 surrounding the refrigerator 31 is provided between the upper surface of the first support base 70A and a lower surface of the second support base 70B. Like the bellows 75, the bellows 76 is a metal bellows structure which can be expanded and contracted in the vertical direction.

Further, a second cooling gas supply unit (not illustrated) which supplies a cooling gas (for example, a second cooling gas) different from the cooling gas (for example, the first cooling gas) flowing through the refrigerant supply flow path 51 may be provided around the refrigerator 31 and the refrigerating heat medium 35. The second cooling gas supply unit supplies the second cooling gas to a space between the refrigerating heat medium 35 and the outer cylinder 63. The second cooling gas is a gas having a thermal conductivity different from that of the first cooling gas flowing through the refrigerant supply flow path 51. The second cooling gas may have a relatively low thermal conductivity so that a temperature of the second cooling gas is relatively higher than a temperature of the first cooling gas flowing through the refrigerant supply flow path 51. Accordingly, it is possible to prevent the first cooling gas leaking from the gap G into a side space from entering the magnetic fluid seal portion 69. In other words, the second cooling gas functions as a counterflow to the first cooling gas leaking from the gap G. According to this configuration, it is possible to prevent the temperature of the magnetic fluid of the magnetic fluid seal portion 69 from decreasing, and thus it is possible to suppress the decrease in the sealing performance and the occurrence of dew condensation. Further, from the viewpoint of enhancing the function as the counterflow, a supply pressure of the second cooling gas supplied from the second cooling gas supply unit may be substantially the same as or slightly higher than a supply pressure of the first cooling gas flowing through the refrigerant supply flow path 51. In addition, as the second cooling gas, a low boiling point gas such as argon gas or neon can be used.

A temperature sensor 82 for detecting a temperature in the gap G or the like and a pressure sensor 83 for detecting a pressure in the gap G or the like are provided at the upper portion of the refrigerating heat medium 35. As the temperature sensor 82, for example, a silicon diode temperature sensor or a low temperature sensor such as a platinum resistance temperature sensor may be used. Measurement data measured by the temperature sensor 82 and the pressure sensor 83 is transmitted to the control device 150 at any time.

Further, among the components of the substrate processing device 200, the refrigeration device 30 is configured to be able to be raised or lowered in an X1 direction by the first elevating device 77, and components other than the refrigeration device 30 and the processing container 10 are configured to be able to be raised or lowered in an X2 direction by the second elevating device 78.

By raising and lowering the refrigeration device 30 with the first elevating device 77, it is possible to prevent the gap G between the mounting table 20 and the refrigerating heat medium 35 from being changed. Specifically, the refrigerating heat medium 35 is shrunk by about several millimeters due to the cold heat thereof, and a height (or width) of the gap G may be changed due to this heat shrinkage. In a film forming process, when the refrigerating heat medium 35 is heat-shrunk with respect to the mounting table 20 fixed at a predetermined height and the gap G is changed, raising and lowering of the refrigeration device 30 are precisely controlled by the first elevating device 77. According to this control, it is possible to eliminate the change in the gap G and continue the film forming process while maintaining an initial gap G.

Meanwhile, for example, the mounting table 20 is raised or lowered inside the processing container 10 by the second elevating device 78, and thus the distance t1 between the target T and the substrate W can be adjusted. The adjustment of the distance t1 is appropriately changed according to a type of the target T to be applied. When the mounting table 20 is raised and lowered to adjust the distance t1, a synchronous control of the first elevating device 77 and the second elevating device 78 is executed by the control device 150. According to the synchronous control of the first elevating device 77 and the second elevating device 78 by the control device 150, it is possible to control the raising and lowering of both the mounting table 20 and the refrigeration device 30 while maintaining the initial gap G.

The control device 150 is constituted by a computer. As illustrated in FIG. 2, the control device 150 includes a Central Processing Unit (CPU) 151, a main storage device 152, an auxiliary storage device 153, an input/output interface 154, and a communication interface 155, which are connected to each other by a connection bus. The main storage device 152 and the auxiliary storage device 153 are computer-readable recording media. Moreover, the above components may be provided individually, or some components may not be provided.

The CPU 151 is also referred to as a Microprocessor (MPU) or a processor and may be a single processor or a multiprocessor. The CPU 151 is a central processing unit which controls the entire control device 150. For example, the CPU 151 expands a program stored in the auxiliary storage device 153 so that the program may be executed in a work area of the main storage device 152, controls a peripheral device through the execution of the program, and thus provides a function matching a predetermined purpose. The main storage device 152 stores a computer program executed by the CPU 151, data processed by the CPU 151, or the like. For example, the main storage device 152 includes a flash memory, a Random Access Memory (RAM), or a Read Only Memory (ROM). The auxiliary storage device 153 stores various programs and various data in a readable and writable recording medium and is also called an external storage device. For example, the auxiliary storage device 153 stores an Operating System (OS), various programs, various tables, or the like, and the OS includes a communication interface program which exchanges data with an external device connected via the communication interface 155, for example. For example, the auxiliary storage device 153 is used as a storage area for assisting the main storage device 152 and stores a computer program executed by the CPU 151, data processed by the CPU 151, or the like. The auxiliary storage device 153 is a silicon disk including a non-volatile semiconductor memory (flash memory, EPROM (Erasable Programmable ROM)), a hard disk drive (HDD) device, a solid-state drive device, or the like. Further, as the auxiliary storage device 153, a drive device for a removable recording medium such as a CD drive device, a DVD drive device, and a BD drive device is exemplified. An example of the removable recording medium includes a CD, a DVD, a BD, a Universal Serial Bus (USB) memory, a Secure Digital (SD) memory card, or the like. The communication interface 155 is an interface with a network connected to the control device 150. The input/output interface 154 is an interface for inputting/outputting data to/from a device connected to the control device 150. For example, a keyboard, a pointing device such as a touch panel or a mouse, an input device such as a microphone, or the like is connected to the input/output interface 154. The control device 150 receives an operation instruction or the like from an operator who operates the input device via the input/output interface 154. Further, for example, a display device such as a Liquid Crystal Panel (LCD) or an organic Electroluminescence (EL) panel, an output device such as a printer or a speaker, or the like is connected to the input/output interface 154. The control device 150 outputs data and information processed by the CPU 151 and data and information stored in the main storage device 152 and the auxiliary storage device 153 via the input/output interface 154. Further, the temperature sensor 82 or the pressure sensor 83 may be connected to the input/output interface 154 by wire or may be connected to the communication interface 155 via a network.

The control device 150 controls operations of various peripheral devices. The peripheral devices include a refrigerant supply device 145, the compression device 140, a refrigerant discharge device 147, the refrigeration device 30, the rotating device 40, the first elevating device 77, the second elevating device 78, the temperature sensor 82, the pressure sensor 83, and a gas exhaust device 85, a processing gas supply device 87, or the like. The CPU 151 executes a predetermined process according to a recipe stored in a storage area such as a ROM. In the recipe, control information of the substrate processing device 200 for process conditions is set. For example, the control information includes a gas flow rate, the pressure in the processing container 10, the temperature in the processing container 10, the temperature of the mounting table 20, the temperature of the refrigerant supplied to the gap G, the height and width of the gap G, various process times, or the like.

Based on the measurement data (monitor information) measured by the temperature sensor 82 and the pressure sensor 83, the control device 150 controls the refrigerant supply device 145, the compression device 140, the refrigerant discharge device 147, and the refrigeration device 30 so that the gap G maintains the initial temperature and pressure.

The control device 150 controls the raising and lowering of the first elevating device 77, and thus, when the height (or width) of the gap G is changed due to the heat shrinkage of the refrigerating heat medium 35, the control device 150 precisely raises or lowers the refrigeration device 30 so that the change of the gap G is eliminated. The heat shrinkage of the refrigerating heat medium 35 is caused by the transfer of cold heat from the refrigerator 31 to the refrigerating heat medium 35 and the flow of the refrigerant through the refrigerant supply flow path 51. By maintaining the initial gap G by the control device 150, it is possible to continue the film forming process while controlling the substrate W to a desired temperature.

Further, the control device 150 synchronously controls the first elevating device 77 and the second elevating device 78. By this synchronous control, the mounting table 20 (and the upper portion of the refrigeration device 30) is raised or lowered inside the processing container 10 while maintaining the initial gap G, and the distance t1 between the target T and the substrate W suitable for the applied target T is adjusted.

Next, returning to FIG. 1, the first refrigerant transfer pipe 100 and the second refrigerant transfer pipe 110 connecting the first connection-fixing units 91 and 92 to the compression device 140 or the refrigerant discharge device (not illustrated), and a housing 120 accommodating the first refrigerant transfer pipe 100 and the second refrigerant transfer pipe 110 will be described in detail.

The first refrigerant transfer pipe 100 connects the compression device 140 such as a compressor communicating with a refrigerant supply device (not illustrated) and the refrigerant supply flow path 51 disposed inside the refrigeration device 30 to each other. The first refrigerant transfer pipe 100 includes a first hard pipe 101 (or a hard hose) which is an approximately L-shaped vent pipe, and a second flexible pipe 102 (or a flexible tube, a flexible hose, or the like) which is connected to an end of the first hard pipe 101 and extends in the vertical direction. The first refrigerant transfer pipe 100 further includes a second hard pipe 103, which is a U-shaped vent pipe to which the second flexible pipe 102 is connected, and a long first flexible pipe 104 to which the second hard pipe 103 is connected. Moreover, in the illustrated example, the first hard pipe 101 is illustrated in a laterally long form in order to illustrate the first refrigerant transfer pipe 100 on a side of the second elevating device 78 or the like. However, an approximately L-shaped pipe which is not laterally long may be applied to the actual first hard pipe 101, and this also applies to a first hard pipe 111 which constitutes the second refrigerant transfer pipe 110.

One end of the first hard pipe 101 is connected and fixed to the first connection-fixing unit 91 which is a flow path port of the refrigerant supply flow path 51 in the refrigeration device 30. Further, one end of the first flexible pipe 104 is connected to a second connection-fixing unit 121. A separate hard pipe 105 is connected to the second connection-fixing unit 121, and the hard pipe 105 is also connected to a third connection-fixing unit 123. A separate hard pipe 106 is also connected to the third connection-fixing unit 123, and the hard pipe 106 is connected to the compression device 140.

In the first refrigerant transfer pipe 100, particularly, the long first flexible pipe 104 is accommodated in the steel housing 120 made of aluminum or the like in a state with a curvature (a curved state). The first flexible pipe 104 extending in a curved state is accommodated in the housing 120 in a state where a curvature radius R of the first flexible pipe 104 is larger than a threshold value of the curvature radius which is a damage limit according to a material and the like.

The refrigerant pumped from the compression device 140 is supplied in the Y1 direction to the refrigerant supply flow path 51 inside the refrigeration device 30 via the hard pipes 106 and 105 and the first refrigerant transfer pipe 100 and is supplied to the gap G via the refrigerant supply flow path 51.

Meanwhile, the second refrigerant transfer pipe 110 connects the refrigerant discharge device (not illustrated) and the refrigerant discharge flow path 52 disposed inside the refrigeration device 30 to each other. Like the first refrigerant transfer pipe 100, the second refrigerant transfer pipe 110 includes the first hard pipe 111 which is an approximately L-shaped vent pipe and a second flexible pipe 112 which is connected to an end of the first hard pipe 111 and extends in the vertical direction. The second refrigerant transfer pipe 110 further includes a second hard pipe 113, which is a U-shaped vent pipe to which the second flexible pipe 112 is connected, and a long first flexible pipe 114 connected to the second hard pipe 113.

One end of the first hard pipe 111 is connected and fixed to the first connection-fixing unit 92 which is a flow path port of the refrigerant discharge flow path 52 in the refrigeration device 30. Further, one end of the first flexible pipe 114 is connected to the second connection-fixing unit 122. A separate hard pipe 115 is connected to the second connection-fixing unit 122, and the hard pipe 115 is connected to the refrigerant discharge device (not illustrated). For example, each of the first connection-fixing units 91 and 92 and the second connection-fixing units 121 and 122 is formed by screwing together two half pipes and has a through hole (neither illustrated) therein. Then, ends of various hard pipes and flexible pipes are fitted into the through holes.

In the second refrigerant transfer pipe 110, the long first flexible pipe 114 is also accommodated in the housing 120 in a state with a curvature, like the first flexible pipe 104.

The refrigerant discharged from the refrigerant discharge flow path 52 is discharged to the refrigerant discharge device in the Y3 direction via the second refrigerant transfer pipe 110 and the hard pipe 115.

In the illustrated example, in the first refrigerant transfer pipe 100 and the second refrigerant transfer pipe 110, a portion of each of the second flexible pipes 102 and 112, a portion of each of the first flexible pipes 104 and 114, and the second hard pipes 103 and 113 are disposed on an exterior from a ceiling of the housing 120. Moreover, the entire first refrigerant transfer pipe 100 and the entire second refrigerant transfer pipe 110 may be accommodated inside the housing 120.

Since most of the first refrigerant transfer pipe 100 and the second refrigerant transfer pipe 110 are accommodated in the housing 120, the first refrigerant transfer pipe 100 and the second refrigerant transfer pipe 110 can be protected by the housing 120. Further, as in the illustrated example, the entire shape of the housing 120 has an approximately L shape according to linear shapes of the curved first refrigerant transfer pipe 100 and second refrigerant transfer pipe 110, and thus the housing is formed such that the overall dimensions are as small as possible while accommodating the first refrigerant transfer pipe 100 and the second refrigerant transfer pipe 110 with a margin.

For example, support members 131 and 132 are attached to a wall surface of the housing 120 inside the housing 120. The support members 131 and 132 support a predetermined region (range of length t2) of each of the ends of the first flexible pipes 104 and 114 constituting the first refrigerant transfer pipe 100 and the second refrigerant transfer pipe 110, more specifically, the ends of the first flexible pipes 104 and 114 connected and fixed to the second connection-fixing units 121 and 122. For example, each of the support members 131 and 132 is a member made of steel which is the same material as that of the housing 120 and is connected to the wall surface of the housing 120 by a bolt or welding. Here, the length t2 of the predetermined region of the end of each of the first flexible pipes 104 and 114 supported by the support members 131 and 132 may be set to a range of about 2 cm, 3 cm to 50 cm.

The support members 131 and 132 support the second connection-fixing units 121 and 122 and the predetermined region of the end of each of the first flexible pipes 104 and 114 from below.

As described above, the refrigeration device 30 is raised or lowered in the X1 direction by the first elevating device 77 in order to eliminate the change in the gap G caused by the heat shrinkage of the refrigerating heat medium 35. Further, when the mounting table 20 is raised or lowered in the X2 direction by the second elevating device 78, the refrigeration device 30 is raised or lowered in the X1 direction by the first elevating device 77 in order to keep the gap G constant. In this way, when the refrigeration device 30 is raised or lowered, the first refrigerant transfer pipe 100 and the second refrigerant transfer pipe 110 connected to the first connection-fixing units 91 and 92 are also raised or lowered in the X4 direction and the X5 direction in synchronization.

Meanwhile, the compression device 140 or the refrigerant discharge device (not illustrated) is fixed to a floor surface, and the second connection-fixing units 121 and 122 are fixed to the compression device 140 or the refrigerant discharge device via the hard pipes 105, 106, and 115.

Therefore, when the first refrigerant transfer pipe 100 and the second refrigerant transfer pipe 110 are raised or lowered according to the raising or lowering of the refrigeration device 30, the ends (connection-fixing units) of the first flexible pipes 104 and 114 connected and fixed to the second connection-fixing units 121 and 122 are displaced relative to the second connection-fixing units 121 and 122 indirectly fixed to the compression device 140 and the refrigerant discharge device. Due to the relative displacement of the end of each of the first flexible pipes 104 and 114, bending and shearing act on the end of each of the first flexible pipes 104 and 114 and the vicinity thereof. Accordingly, the end of each of the first flexible pipes 104 and 114 and the vicinity thereof may be damaged due to repeated bending and shearing.

In the substrate processing device 200, the support members 131 and 132 are attached to the inside of the housing 120 and support the second connection-fixing units 121 and 122 and the predetermined region of the end of each of the first flexible pipes 104 and 114 connected and fixed to the second connection-fixing units 121 and 122. According to this configuration, when the refrigeration device 30 is raised and lowered, even when almost the entire area of the first refrigerant transfer pipe 100 and the second refrigerant transfer pipe 110 is raised and lowered in synchronization, the ends of the first flexible pipes 104 and 114 connected and fixed to the second connection-fixing units 121 and 122 are prevented from being raised or lowered. As a result, the bending or shearing is prevented from acting on the ends of the first flexible pipes 104 and 114 connected and fixed to the second connection-fixing units 121 and 122, or the vicinities thereof, and thus damage to the first flexible pipes 104 and 114 is prevented.

Further, since the first refrigerant transfer pipe 100 and the second refrigerant transfer pipe 110 include the second flexible pipes 102 and 112 extending in the vertical direction, the second flexible pipes 102 and 112 can absorb an impact when the refrigeration device 30 is raised and lowered. Further, since the second flexible pipes 102 and 112 are expanded or contracted, it is possible to suppress raising and lowering of other constituent pipes of the first refrigerant transfer pipe 100 and the second refrigerant transfer pipe 110.

Further, since the first refrigerant transfer pipe 100 and the second refrigerant transfer pipe 110 have the U-shaped second hard pipes 103 and 113 in the middle thereof, for example, it is possible to eliminate the increase in the total length of the refrigerant transfer pipe, which may occur when the entire refrigerant transfer pipe is formed by a flexible pipe. As described above, since the curvature radius of the flexible pipe is set according to a material thereof or the like, if the curvature radii set in a plurality of bent portions (in the illustrated example, the first refrigerant transfer pipe 100 and the second refrigerant transfer pipe 110 have four bent portions) are satisfied, the total length of the flexible pipe will naturally increase. Then, as the total length of the flexible pipe becomes longer, the size of the housing for accommodating the refrigerant transfer pipe should also be larger, but the increase in the size can be prevented by applying the U-shaped second hard pipes 103 and 113 to the refrigerant transfer pipes.

Further, in the substrate processing device 200, the third connection-fixing unit 123 is provided between the second connection-fixing unit 121 and the compression device 140, and thus the hard pipe 105 directly connected to the second connection-fixing unit 121 is not directly connected to the compression device 140. According to this configuration, it is possible to make it difficult for vibrations during operation of the compression device 140 to be propagated to the second connection-fixing unit 121. Accordingly, it is possible to prevent the end of the first flexible pipe 104 connected to the second connection-fixing unit 121 from being vibrated repeatedly by this vibration and thus the end of the flexible pipe 104 from being damaged.

Next, in a method of manufacturing the substrate processing device according to the embodiment, characteristic processes will be described as follows. That is, in a process of manufacturing the substrate processing device 200 illustrated in FIG. 1, the support members 131 and 132 corresponding to the first refrigerant transfer pipe 100 and the second refrigerant transfer pipe 110 are attached to the inside of the housing 120. Then, the first refrigerant transfer pipe 100 and the second refrigerant transfer pipe 110 are connected and fixed to the first connection-fixing units 91 and 92 and the second connection-fixing units 121 and 122 in a curved state. In this case, the predetermined region (range of length t2) of the end of each of the first flexible pipes 104 and 114 connected and fixed to the second connection-fixing units 121 and 122, and the second connection-fixing units 121 and 122 are installed on the support members 131 and 132 and supported by the support members 131 and 132 (a process of placing the refrigerant transfer pipe on the support member).

According to the substrate processing device 200 manufactured by this manufacturing method, it is possible to prevent the end of each of the first flexible pipes 104 and 114 connected and fixed to the second connection-fixing units 121 and 122 and the vicinity (range of length t2) thereof from being raised or lowered when the refrigeration device 30 is raised or lowered. As a result, it is possible to prevent bending or shearing from acting on the end of each of the first flexible pipes 104 and 114 connected and fixed to the second connection-fixing units 121 and 122 and the vicinity thereof and thus to prevent the first flexible pipes 104 and 114 from being damaged.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures.

For example, in the above embodiment, the case where the substrate processing device 200 is a film forming device is described as an example, but the substrate processing device 200 may be an etching device or the like, for example.

What is claimed is:

1. A substrate processing device comprising:
   a processing container including a mounting table on which a substrate is mounted and a target holder configured to hold a target, in the processing container;
   a refrigeration device disposed to have a gap between a lower surface of the mounting table and the refrigeration device, the refrigeration device having a refrigerator and a refrigerating heat medium stacked on the refrigerator;
   a first elevating device configured to raise or lower the refrigeration device;
   a refrigerant flow path provided inside the refrigeration device to supply a refrigerant to the gap;
   a compression device configured to compress the refrigerant supplied to the refrigerant flow path; and
   refrigerant transfer pipes connected and fixed to both first connection-fixing units which are a flow path port of the refrigerant flow path in the refrigeration device and second connection-fixing units which fluid-communicate with the compression device,
   wherein each of the refrigerant transfer pipes extends in a state in which at least a portion of the refrigerant transfer pipes is curved between the first connection-fixing units and the second connection-fixing units, and each of the refrigerant transfer pipes is placed on a support member at the second connection-fixing units.

2. The substrate processing device of claim 1, wherein the first elevating device raises or lowers the refrigeration device and the mounting table together.

3. The substrate processing device of claim 1, further comprising:
   a second elevating device configured to raise or lower the mounting table; and
   a control device,
   wherein the control device executes a synchronous control of the first elevating device and the second elevating device to adjust a distance between the target and the mounting table.

4. The substrate processing device of claim 1, wherein a third connection-fixing unit is provided between the compression device and the second connection-fixing units, and
   the compression device and the third connection-fixing unit fluid-communicate with each other, and the third connection-fixing unit and the second connection-fixing units fluid-communicate with each other.

5. The substrate processing device of claim 2, wherein a third connection-fixing unit is provided between the compression device and the second connection-fixing units, and
   the compression device and the third connection-fixing unit fluid-communicate with each other, and the third connection-fixing unit and the second connection-fixing units fluid-communicate with each other.

6. The substrate processing device of claim 3, wherein a third connection-fixing unit is provided between the compression device and the second connection-fixing units, and
   the compression device and the third connection-fixing unit fluid-communicate with each other, and the third connection-fixing unit and the second connection-fixing units fluid-communicate with each other.

7. The substrate processing device of claim 1, wherein at least the refrigerant transfer pipes, the second connection-fixing units, and the support member are accommodated inside a housing.

8. The substrate processing device of claim 2, wherein at least the refrigerant transfer pipes, the second connection-fixing units, and the support member are accommodated inside a housing.

9. The substrate processing device of claim 3, wherein at least the refrigerant transfer pipes, the second connection-fixing units, and the support member are accommodated inside a housing.

10. The substrate processing device of claim 1, wherein the refrigerant transfer pipes include a first non-flexible pipe connected and fixed to the first connection-fixing units and a first flexible pipe connected and fixed to the second connection-fixing units, and extend in a state where the first flexible pipe is curved.

11. The substrate processing device of claim 2, wherein the refrigerant transfer pipes include a first non-flexible pipe connected and fixed to the first connection-fixing units and a first flexible pipe connected and fixed to the second connection-fixing units, and extend in a state where the first flexible pipe is curved.

12. The substrate processing device of claim 3, wherein the refrigerant transfer pipes include a first non-flexible pipe connected and fixed to the first connection-fixing units and a first flexible pipe connected and fixed to the second connection-fixing units, and extend in a state where the first flexible pipe is curved.

13. The substrate processing device of claim 10, wherein the refrigerant transfer pipes include a second flexible pipe and a U-shaped second non-flexible pipe which extend in a vertical direction between the first non-flexible pipe and the first flexible pipe, and
   one end of the second flexible pipe is connected to the first non-flexible pipe, one end of the second non-flexible pipe is connected to the other end of the second flexible pipe, and one end of the first flexible pipe is fixed to the other end of the second non-flexible pipe.

14. The substrate processing device of claim 12, wherein the refrigerant transfer pipes include a second flexible pipe and a U-shaped second non-flexible pipe which extend in a vertical direction between the first non-flexible pipe and the first flexible pipe, and
   one end of the second flexible pipe is connected to the first non-flexible pipe, one end of the second non-flexible pipe is connected to the other end of the second flexible pipe, and one end of the first flexible pipe is fixed to the other end of the second non-flexible pipe.

15. The substrate processing device of claim 1, wherein the refrigerant flow path includes a supply flow path through which the refrigerant is supplied to the gap and a discharge flow path through which the refrigerant of which a temperature is increased by cooling the mounting table is discharged from the gap,
   the refrigerant transfer pipes include a first refrigerant transfer pipe through which the refrigerant is supplied to the supply flow path and a second refrigerant transfer pipe through which the refrigerant is discharged from the discharge flow path, and
   the first refrigerant transfer pipe and the second refrigerant transfer pipe are placed on the support members respectively corresponding to the first refrigerant transfer pipe and the second refrigerant transfer pipe.

16. The substrate processing device of claim 2, wherein the refrigerant flow path includes a supply flow path through which the refrigerant is supplied to the gap and a discharge flow path through which the refrigerant of which a temperature is increased by cooling the mounting table is discharged from the gap,
   the refrigerant transfer pipes include a first refrigerant transfer pipe through which the refrigerant is supplied to the supply flow path and a second refrigerant transfer pipe through which the refrigerant is discharged from the discharge flow path, and
   the first refrigerant transfer pipe and the second refrigerant transfer pipe are placed on the support members respectively corresponding to the first refrigerant transfer pipe and the second refrigerant transfer pipe.

17. The substrate processing device of claim 3, wherein the refrigerant flow path includes a supply flow path through which the refrigerant is supplied to the gap and a discharge flow path through which the refrigerant of which a temperature is increased by cooling the mounting table is discharged from the gap,
   the refrigerant transfer pipes include a first refrigerant transfer pipe through which the refrigerant is supplied to the supply flow path and a second refrigerant transfer pipe through which the refrigerant is discharged from the discharge flow path, and
   the first refrigerant transfer pipe and the second refrigerant transfer pipe are placed on the support members respectively corresponding to the first refrigerant transfer pipe and the second refrigerant transfer pipe.

18. A method of manufacturing a substrate processing device including a processing container including a mounting table on which a substrate is mounted and a target holder configured to hold a target, in the processing container, a refrigeration device disposed to have a gap between a lower surface of the mounting table and the refrigeration device, the refrigeration device having a refrigerator and a refrigerating heat medium stacked on the refrigerator, a first elevating device configured to raise or lower the refrigeration device, a refrigerant flow path provided inside the refrigeration device to supply a refrigerant to the gap, a compression device configured to compress the refrigerant supplied to the refrigerant flow path, and refrigerant transfer pipes connected and fixed to both first connection-fixing units which are a flow path port of the refrigerant flow path in the refrigeration device and second connection-fixing units which fluid-communicate with the compression device, the method comprising:

extending each of the refrigerant transfer pipes in a state where at least a portion of the refrigerant transfer pipes is curved between the first connection-fixing units and the second connection-fixing units, and placing each of the refrigerant transfer pipes on a support member at the second connection-fixing units.

* * * * *